United States Patent [19]

Nakamura

[11] Patent Number: 5,218,512
[45] Date of Patent: Jun. 8, 1993

[54] FERROELECTRIC DEVICE

[75] Inventor: Takashi Nakamura, Kyoto, Japan

[73] Assignee: Rohm Co., Ltd.

[21] Appl. No.: 929,363

[22] Filed: Aug. 14, 1992

[30] Foreign Application Priority Data

Aug. 16, 1991 [JP] Japan .................................. 3-205874
Aug. 16, 1991 [JP] Japan .................................. 3-205875

[51] Int. Cl.⁵ ...................... H01G 4/10; G11C 11/22; H01L 27/02
[52] U.S. Cl. .................................... 361/321; 365/145; 257/528
[58] Field of Search ................. 361/311-313, 361/321; 357/51; 365/145; 501/134-138

[56] References Cited

U.S. PATENT DOCUMENTS

| | | | |
|---|---|---|---|
| 4,437,139 | 3/1984 | Howard | 361/313 |
| 4,503,482 | 3/1985 | Hennings et al. | 361/321 |
| 4,948,767 | 8/1990 | Ushida et al. | 501/134 |
| 5,099,305 | 3/1992 | Takenaka | 357/51 |
| 5,109,357 | 4/1992 | Eaton | 365/145 |
| 5,142,437 | 8/1992 | Kammerdiner et al. | 361/313 |

*Primary Examiner*—Donald A. Griffin
*Attorney, Agent, or Firm*—Wenderoth, Lind & Ponack

[57] ABSTRACT

An intermediate layer for relieving film fatigue is formed between the conductor and the ferroelectric layer for constituting a ferroelectric device, whereby the film fatigue can be reduced on the surface with respect to the conductor of the ferroelectric layer by this construction.

4 Claims, 3 Drawing Sheets

FERROELECTRIC DEVICE

BACKGROUND OF THE INVENTION

The present invention generally relates to a ferroelectric device for using the polarization inversion of a ferroelectric such as ferroelectric memory or the like, and more particularly, to a capacitor for relieving distortion stress on the surface so as to improve the characteristics.

Conventionally in this type of capacitor, F.C.C. metal (mainly Pt) is often used as a conductive electrode 2 so as to improve the crystal orientation property of the ferroelectric 2 as shown in FIG. 1. Although it is proposed to form $Ta_2O_5$, for example, between a PZT and an electrode, a dielectric constant is still small in the $Ta_2O_5$ ($\epsilon r \approx 25$) and the inversion voltage becomes high. Further, the crystal property is completely different form the PZT, with a disadvantage that the crystal property becomes worse.

Film fatigue by the polarization inversion in the conventional art is considered to be caused mainly by the orientation properly of the film. It is recently announced that the film fatigue is not solved if the orientation property is improved.

As the ferroelectric (PZT or the like) of a perovskite type cause displacement polarization, the distortion is caused on the surface between what do not cause the displacement polarization such as Pt and so on. The grid breakdown and so on are caused on the surface, because of distortion, into the film fatigue. The present invention relieves the distortion on the surface to be caused on such conventional capacitor as described hereinabove so as to reduce the film fatigue.

SUMMARY OF THE INVENTION

Accordingly, the present invention has been developed with a view to substantially eliminating the above discussed drawbacks inherent in the prior art and has for its essential object to provide an improved ferroelectric device.

Another important object of the present invention is to provide an improved ferroelectric device, where in a capacitor which grasps by a pair of conductors a ferroelectric having spontaneous polarization by the displacement polarization, the present invention has perovskite construction the same as or similar to the ferroelectric layer as an intermediate layer as an object of relieving stress relief between the ferroelectric and each conductor, and has the displacement polarization caused in the same direction by the electric field, further elasticity is weak, and/or what the residual polarization takes 0 or a value close to it is interposed in the operating temperature such as normal temperature or the like.

Preferable conditions as the material quality of the intermediate layer are desired that the displacement polarization be caused by the electric field, the spontaneous polarization by the displacement like the paradielectric, antiferroelectric be 0 or a value close to it, and elasticity be weak, the molecular structure be similar to that of the ferroelectric, further the dielectric constant be higher.

What is applied to the above described conditions when the PZT ($PbZr_xTi_{1-x}O_3$) is used for, for example, ferroelectric, the intermediate layer has perovskite construction or construction similar to it like $PbZrO_3$ which is $SrTiO_3$ (paraelectric) or antiferroelectric, has 0 or a value (in operating temperature) close to it in residual polarization like paraelectric, antiferroelectric.

When $SrTiO_3$ is used as an intermediate layer of the ferroelectric device of the present invention as described hereinabove, $V_F$ of the same degree can be provided if a film is approximately fifty times as thick as silicone oxidizing film, is approximately thirty times as thick as silicone nitride film as the $SrTiO_3$ is 200 or so in specific inductive constant. Thus, it is advantageous even in the reduction in the area by the refining operation.

Therefore, the present invention increases the number of the rewriting possibilities of the memory element for using it by the decrease in the film fatigue to be accompanied by the polarization inversion, or the stress on the surface is relieved when the external electric field is 0 so that data retaining time become longer.

Also, in accomplishing these and other objects, according to one preferred embodiment of the present invention, in a ferroelectric device having construction of laminating a ferroelectric having spontaneous polarization by the displacement polarization on a semiconductor basic plate or a semiconductor thin film, further laminating a conductor on it, the present invention has perovskite construction the same as or similar to the ferroelectric layer as an intermediate layer as an object of stress relief between the above described ferroelectric—semiconductor, or ferroelectric—conductor, the displacement polarization is caused in the same direction as that of the ferroelectric layer by the electric field, further what the residual polarization takes 0 or a value to it is interposed at the operating temperature.

Preferable conditions as the material quality of the above described intermediate layer are desired that the displacement polarization be caused by the electric field, the spontaneous polarization by the displacement as in the paraelectric • antiferroelectric be 0 or be close to it, further elasticity be weak, the perovskite which is similar to the ferroelectric in molecular structure be provided, further the dielectric constant be high.

What is applied to the above described conditions when the PZT ($PbZr_xTi_{1-x}O_3$) is used for, for example, ferroelectric layer is that the intermediate layer has perovskite construction or construction similar to it like $PbZrO_3$ which is $SrTiO_3$ (paraelectric) or antiferroelectric, what is 0 or a value (at operating temperature) close to it in residual polarization like paraelectric, antiferroelectric.

When $SrTiO_3$ is used as an intermediate layer of the ferroelectric device of the present invention as described hereinabove, $V_F$ of the same degree can be provided if a film is approximately fifty times as thick as silicone oxidizing film, is approximately thirty times as thick as silicone nitride film as the $SrTiO_3$ is 200 or so in specific dielectric constant. Thus, it is advantageous even in the reduction in the area by the refining operation.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
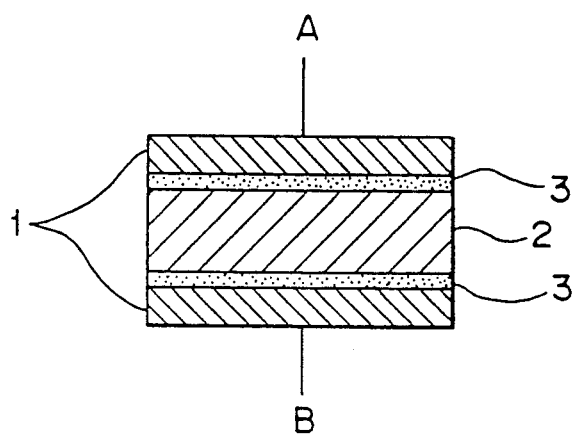
FIG. 1 is a view for illustrating a capacitor in one embodiment of a ferroelectric device of the present invention.

Before the description of the present invention proceeds, it is to be noted that like parts are designated by like reference numerals throughout the accompanying drawings.

The embodiment of a ferroelectric device of the present invention will be described hereinafter with reference to the drawings.

Referring now to FIG. 1 through FIG. 5, reference numeral 4 is a semiconductor basic plate, reference numeral 7 is an impurity injecting layer, reference numeral 5 is an insulation film, reference numeral 2 is a ferroelectric provided on a semiconductor basic plate 4, reference numeral 3 is an intermediate layer composed of a pair of stress relieving $SrTiO_3$ provided in the upper portion and the lower portion of the ferroelectric layer 2, with reference numeral 1 being a pair of conductive electrodes provided on further outer side of the intermediate layer 3. Reference numeral 6 is a wiring layer, reference numeral 8 is a gate electrode, reference numeral 9 is a gate oxidizing film.

FIG. 1 is a single capacitor, where a conductor electrode 1, an intermediate layer 3, a ferroelectric basic plate 2, an intermediate layer 3, a conductor electrode 1 are piled up in order.

The intermediate layer 3 which is interposed between the conductor electrode 1 and the ferroelectric basic plate 2 in the capacitor of such construction as described hereinabove has an object of relieving the stress on the surface. The conditions of a material to be used in the intermediate layer are preferable that perovskite construction the same as or similar to the ferroelectric be provided, the displacement polarization be caused in the same direction as that of the ferroelectric by the electric field, further elasticity be weak, and further the residual polarization take 0 or a value close to it in the operating temperature. When the PZT ($PbZr_xTi_{1-x}O_3$) is used for, for example, ferroelectric as an intermediate layer to be used in the present invention, what is applied to the above described conditions is that the perobuskite construction or construction similar to it like $PbZrO_3$ which is $SrTiO_3$ (paraelectric) or antiferroelectric is provided, and the residual polarization as in paraelectric, antiferroelectric is 0 or a value in operating temperature.

Suppose that displacements in the conductor, ferroelectric, intermediate layer by polarization are respectively $X_M$, $X_F$, $X_B$ in the ferroelectric device as the capacitor of such construction as described hereinabove, and distortions are caused corresponding to conductor - intermediate layer $|X_M - X_B| \approx X_B$ ... (i)

intermediate layer - ferroelectric $|X_B - X_F|$ ... (ii)

on the respective surfaces as the distortion by them. By the (ii), it is found out that the distortion to be applied upon the ferroelectric is relieved as the $X_B$ becomes closer to $X_F$. Inversely, although the (i) becomes larger in distortion as $X_B$ is larger, the surface is one which does not participate directly in polarization inversion in the (i). In the construction of the such ferroelectric capacitor, when the polarization is inverted, it becomes larger gradually than it does when the polarization is not inverted. It is considered that larger influences are not applied upon the film fatigue on the surfaces of the (i), (ii) if the $X_B$ becomes slightly larger.

That the polarization by the displacement is not 0 when the external electric field has been made 0 means the polarization inversion even in the intermediate layer. As the distortion similar to that when the intermediate layer is not formed is caused on the surface between the intermediate layer and the conductor, effects are removed. The above described problem is removed by the use of the 0 or a value close to it in residual polarization at the operating temperature on the intermediate layer as described in the present invention.

In the $X_B = 0$ in the external external field 0, distortion equivalent to the $X_F$ remains only on the surface of the (ii) in the (i), (ii). As the distortion is caused by the stress, it depends upon the elasticity of the film for forming the intermediate layer. As the elasticity is stronger with respect to the metal of such F.C.C. construction as in Pt, the stress with respect to the polarization displacement of the ferroelectric becomes stronger and the retaining characteristics of the polarization becomes worse. The stress becomes smaller by the formation of the weak elasticity as the intermediate layer as in the present invention, thus improving the retaining characteristics of the polarization.

When construction completely different from the construction of the ferroelectric is used in the intermediate layer, mismatching is caused in the face orientation and the grid distance, crystalline property of the ferroelectric, surface condition and so on are deteriorated, thus causing larger fatigue fatigue. The above described problem is considered to be improved by the selection of the construction the same as or similar to the ferroelectric as the relief layer like in the present invention.

Figure 2:
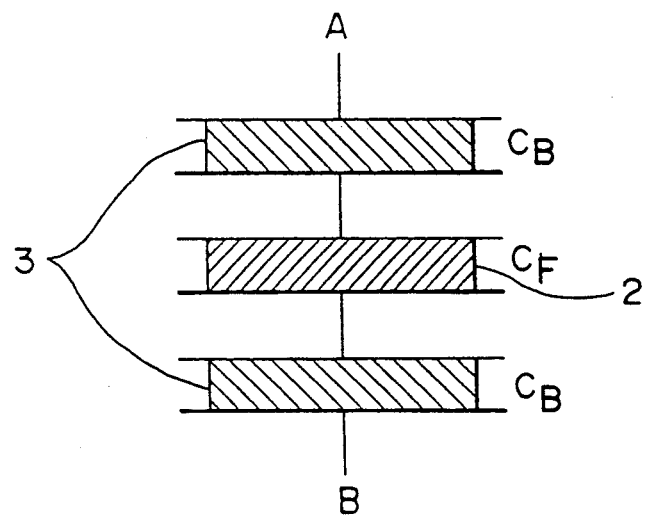
FIG. 2 is an equivalent circuit diagram of a ferroelectric device shown in FIG. 1.

The ferroelectric capacitor which has the above described construction, namely, construction shown in FIG. 1 becomes equivalent to one with the capacitors of the circuit construction as shown in FIG. 2 being arranged in series. $C_B$, $C_F$ are respectively a relief layer and capacity of the ferroelectric. Suppose that the voltages to be applied upon the $C_B$, the $C_F$ when the voltage $V_O$ is applied upon between AB are respectively $V_B$, $V_F$, and accumulation electric charge amount is Q, and $$V_F = V_O - 2V_B = V_O - 2Q/C_B = V_O - 2Qd_B/\epsilon_B\epsilon_O A_B.$$ (iii)

wherein
$\epsilon_O$: dielectric constant of vacuum
$\epsilon_B$: specific dielectric constant of intermediate layer
$d_B$: distance between electrodes (film thickness) of intermediate layer
$A_B$: (electrode) area of intermediate layer it is found that $V_F$ becomes larger as the $\epsilon_B$ becomes larger. A certain degree of $V_F$ is necessary to inverse in polarity the ferroelectric. Or there is a merit that the polarization inversion speed becomes faster as the $V_F$ is larger. $Ta_2O_5$ ($\epsilon r \approx 25$) in the conventional art is not sufficiently large in dielectric constant. When the comparison is effected with high dielectric constant of characteristics like $SrTiO_3$ ($\epsilon r \approx 200$), the same degree of $V_F$ cannot be obtained unless the film is made approximately one eighth in thickness. It is advantageous even in the reduction of the area by the refining operation. A material large in dielectric constant is preferable as a material of the intermediate layer to be used in the present invention.

Figure 3:
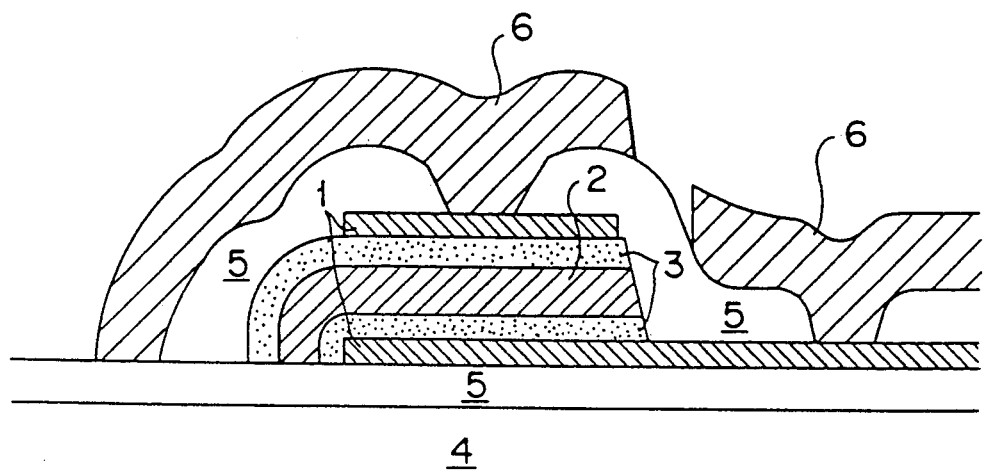
FIG. 3 is a view for illustrating another embodiment where the ferroelectric capacitor of the present invention is provided on a semiconductor basic plate.
Figure 4:
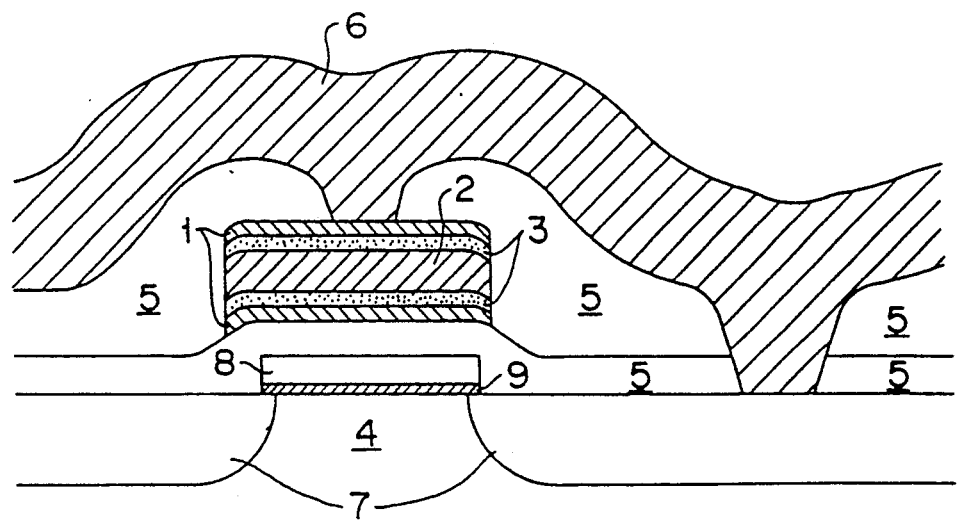
FIG. 4 is a view for illustrating still another embodiment where the ferroelectric capacitor of the present invention is provided together with a transistor on the semiconductor basic plate.

FIG. 3 is a sectional embodiment where a laminated capacitor of construction similar to that of FIG. 1 on the semiconductor basic plate 4. FIG. 4 is one embodiment of a memory element where the capacitor has construction similar to FIG. 1 the same as the transistor on the semiconductor basic plate 4 with the use of the intermediately layer.

Figure 5:
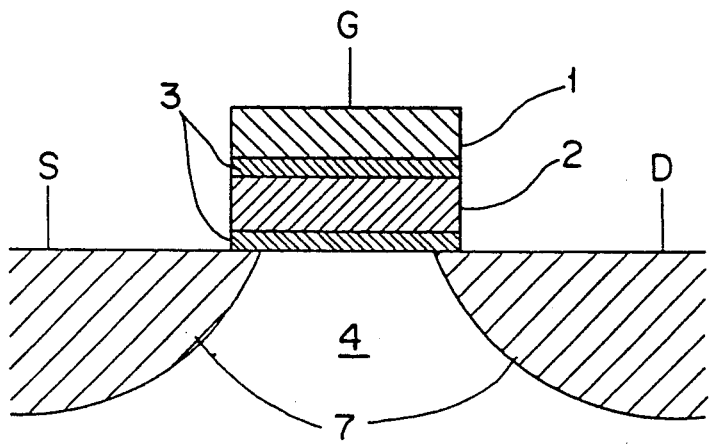
FIG. 5 is a view for illustrating a further embodiment of the ferroelectric device of the present invention.
Figure 6:
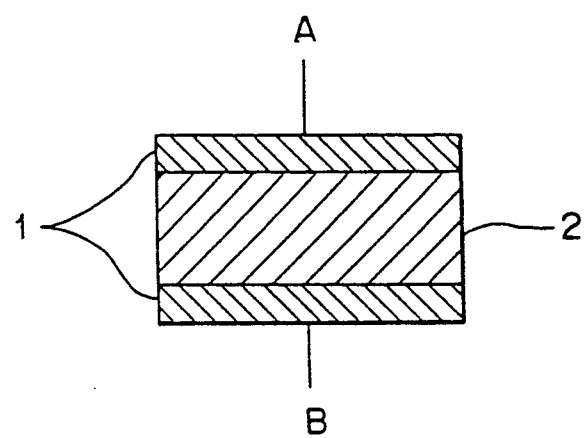
FIG. 6 is a view for illustrating one example of the construction of the conventionally used ferroelectric device.

FIG. 5 shows another embodiment of a ferroelectric device of the present invention. Referring now to FIG. 5, reference numeral 4 is a semiconductor basic plate, reference numeral 7 is an impurity injection layer, reference numeral 2 is a ferroelectric layer provided on the semiconductor basic plate 4, reference numeral 1 is a gate electrode provided on the ferroelectric layer 2 with what is composed of $SrTiO_3$ of paraelectric having perovskite construction as intermediate layer 3 respectively between the above described semiconductor basic plate 4 and the ferroelectric layer 2, and between the above described ferroelectric layer 2 and the gate electrode 1 being interposed. Reference character G is a gate, reference character S is a source, reference character D is drain.

As the conditions of a material to be used as the intermediate layer 3 to be formed as an object of relieving between a conductor electrode 1 and a ferroelectric layer 2 or the semiconductor basic plate 4 and the ferroelectric layer 2 in such construction as described hereinabove, it is preferable that the displacement polarization is caused by an electric field, the dielectric constant is higher, paraelectric, antiferroelectric or a nature close to it at the operating temperature such as normal temperature or the like, the construction is similar to the ferroelectric layer, and further elasticity is stronger. By the interposing of the intermediate layer provided with such conditions, one type of relief layer is formed between the conductor electrode and the ferroelectric layer or the semiconductor basic plate and the ferroelectric layer so that the film fatigue to be caused on the surface can be reduced.

Suppose that displacements in the conductor electrode, ferroelectric layer, semiconductor basic plate, intermediate layer by polarization are respectively $X_M$, $X_F$, $X_S$, $X_B$ in the ferroelectric device of such construction as described hereinabove, and distortions are caused corresponding to conductor − relief layer $|X_M − X_B| \approx X_B$ ... (i)
relief layer − ferroelectric $|X_B − X_F|$ ... (ii)
relief layer − semiconductor $|X_B − X_S| \approx$ ... (iii)

on the respective surfaces. By the (ii), it is found out that the distortion to be applied upon the ferroelectric film is relieved as the $X_B$ becomes closer to $X_F$. Inversely, although the (i), (iii) become larger in distortion as $X_B$ is larger, the surface is one which does not participate directly in polarization inversion which is polarized on the face of the ferroelectric layer in the (i), (iii). When F is inverted in the MFS construction, the film fatigue becomes larger gradually than it does when it is not inverted. It is considered that larger influences are not applied upon the film fatigue on the surfaces of the (i), (iii) if the $X_B$ becomes slightly larger.

That the polarization by the displacement is not 0 when the external electric field has become 0 means the polarization inversion even in the intermediate layer. As the distortion similar to MFS construction is caused on the surface between the intermediate layer - conductor electrode, the intermediate layer - the semiconductor basic plate, the effect is removed. In the $X_B=0$ on the external electric field 0, the distortion equivalent to $X_F$ remains only on the surface of the (ii) in the (i), (ii), (iii). As the distortion depends upon the stress, it naturally depends upon the elasticity of the film. As the elasticity of the intermediate layer is smaller, the stress with respect to the polarization displacement of the ferroelectric layer becomes smaller as the elasticity of the intermediate layer is smaller, thus improving the retaining characteristics of the polarization.

In the conventional MFS construction, diamond construction and zinc construction are used often in M, S, and probuskite construction is often used in F. When mismatching is caused in the face orientation and the distance between grids due to the different crystalline construction, the crystal property of the ferroelectric, the surface condition and so on are deteriorated, thus causing larger film fatigue. The above described problem is improved by the selection of the perovskite construction the same as or similar to the ferroelectric on the intermediate layer in the present invention.

Such construction as shown in FIG. 5 becomes equivalent to what capacitors are arranged in series as shown in FIG. 2. $C_B$, $C_F$ are respectively an intermediate layer and capacity of the ferroelectric layer. Suppose that the voltages to be applied upon the $C_B$, the $C_F$ when the voltage $V_G$ is applied upon G are respectively $V_B$, $V_F$, and accumulation electric charge capacity amount is Q, and $$V_F = V_G - 2V_B = V_G - 2Q/C_B = V_G - 2Qd_B/\epsilon_B\epsilon_0 A_B \quad \text{(iv)}$$

wherein
  $\epsilon_O$: dielectric constant of vacuum
  $\epsilon_B$: specific dielectric constant of intermediate layer
  $d_B$: distance between electrodes (film thickness) of intermediate layer
  $A_B$: (electrode) area of intermediate layer it is found that $V_F$ becomes larger as the $\epsilon_B$ becomes larger. A certain degree of $V_F$ is necessary to inverse in polarity the ferroelectric. Or there is a merit that the polarization inversion speed becomes faster as the $V_F$ is larger. If the dielectric constant is low like silicone film oxide ($\epsilon r \approx 3.8$), silicone film nitride ($\epsilon r \approx 7$) in the conventional art, the $V_F$ becomes considerably small even in the extremely thin film. In a specific dielectric constant is approximately 200 like, for example, $SrTiO_3$ of the present invention, the same degree of $V_F$ can be obtained if the film thickness is approximately fifty times as thick as the silicone film oxide, approximately thirty times as thick as the silicone film nitride. Also, the present invention is advantageous even in the reduction in the area by the refining operation. Therefore, a material large in dielectric constant as an intermediate layer is preferable.

What is applied to the above described conditions when PZT Pb(ZrTi)O$_3$ is used for, for example, ferroelectric layer as an intermediate to be used in the present embodiment has construction of peroskite construction and construction similar to it like PbZrO$_3$ which is SrTio$_3$ (paraelectric) and antiferroelectric described hereinabove, the residual polarization, such as paraelectric, antiferroelectric, of 0 or a value close to it (at operating temperature).

As is clear from the foregoing description, according to the arrangement of the present invention, an intermediate layer composed of SrTiO$_3$ above and below the ferroelectric having spontaneous polarization by the displacement polarization is laminated, further a conductor is laminated on it in construction, and a ferroelectric device having construction of interposing an intermediate layer with an object of relieving the stress between the ferroelectric and the conductor is created.

As the other modified embodiment, in construction where a ferroelectric having spontaneous polarization by the displacement polarization is laminated on semiconductor basic plate or the semiconductor thin film, further a conductor is laminated on it, a ferroelectric device is created which has construction of interposing the intermediate layer as an object of stress relief between the ferroelectric - semiconductor basic plate or the ferroelectric - conductor. The present invention increases the number of the rewriting possibilities of the memory element for using it by the decrease in the film fatigue to be accompanied by the polarization inversion, or the stress on the surface is relieved when the external electric field is 0 so that data retaining time become longer.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A ferroelectric device comprising; a pair of conductor basic plates, a ferroelectric having spontaneous polarization by displacement polarization and interposed in construction between a pair of conductor basic plates, and intermediate layers respectively interposed between the ferroelectric and the conductor for stress relief use on the surface having a perovskite construction where displacement polarization is caused in the same direction as that of the ferroelectric and residual polarization becomes approximately 0 at normal temperature.

2. The ferroelectric device as fefined in claim 1, wherein the ferroelectric is a ferroelectric thin film.

3. The ferroelectric device as defined in claim 1, wherein the conductor basic plates are conductor thin films.

4. A ferroelectric device comprising; a semiconductor basic plate a ferroelectric having spontaneous polarization by the displacement polarization and laminated on the semiconductor basic plate, a conductor laminated in construction on the ferroelectric, an intermediate layer interposed respectively among the ferroelectric, semiconductor and conductor. for stress relief having perobustkite where the displacement polarization is caused in the same direction as that of the ferroelectric and the residual polarization becomes approximately 0 at normal temperature.

* * * * *